(12) United States Patent
Tanaka

(10) Patent No.: US 9,073,744 B2
(45) Date of Patent: Jul. 7, 2015

(54) PHYSICAL QUANTITY SENSOR AND ELECTRONIC APPARATUS

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 65 days.

(21) Appl. No.: 13/857,317

(22) Filed: Apr. 5, 2013

(65) Prior Publication Data
US 2013/0264661 A1 Oct. 10, 2013

(30) Foreign Application Priority Data

Apr. 9, 2012 (JP) .................................. 2012-088607

(51) Int. Cl.
*G01L 1/00* (2006.01)
*B81B 3/00* (2006.01)

(52) U.S. Cl.
CPC ............. *B81B 3/0018* (2013.01); *B81B 3/0021* (2013.01)

(58) Field of Classification Search
None
See application file for complete search history.

(56) References Cited

U.S. PATENT DOCUMENTS

| 5,404,749 | A  | 4/1995  | Spangler       |
|-----------|----|---------|----------------|
| 5,488,864 | A  | 2/1996  | Stephan        |
| 5,905,203 | A  | 5/1999  | Flach et al.   |
| 6,513,380 | B2 | 2/2003  | Reeds, III et al. |
| 7,121,141 | B2 | 10/2006 | McNeil         |
| 8,079,262 | B2 | 12/2011 | Guo            |

FOREIGN PATENT DOCUMENTS

| JP | 06-308152    | 11/1994 |
| JP | 09-189716    | 7/1997  |
| JP | 2007-298405  | 11/2007 |
| JP | 2009-109494  | 5/2009  |
| JP | 2009-537803  | 10/2009 |
| WO | 2007-131835  | 11/2007 |

*Primary Examiner* — Lisa Caputo
*Assistant Examiner* — Brandi N Hopkins
(74) *Attorney, Agent, or Firm* — Harness, Dickey & Pierce, P.L.C.

(57) ABSTRACT

A physical quantity sensor includes a substrate, a movable body which has first and second sections and in which a first movable electrode section is provided in the first section, a beam section which supports the movable body so as to be able to be displaced, and a first fixed electrode section disposed on the substrate. The first fixed electrode section is provided at a position overlapping an end of the first section in the second axis direction in plan view, and is provided in a range of $0.0500X \le L \le 0.816X$ assuming that the width of the first section in the second axis direction is X and the width of a portion of the first fixed electrode section in the second axis direction overlapping the movable body in plan view is L.

9 Claims, 7 Drawing Sheets

PHYSICAL QUANTITY SENSOR AND ELECTRONIC APPARATUS

BACKGROUND

1. Technical Field

The present invention relates to a physical quantity sensor and an electronic apparatus.

2. Related Art

In recent years, techniques for realizing a small and high-sensitivity physical quantity sensor using a silicon MEMS (Micro Electro Mechanical System) technique, for example, have been developed.

For example, JP-T-2009-537803 discloses a physical quantity sensor (acceleration sensor) with a mass body having two wings that can rotate around a torsion web. In the physical quantity sensor disclosed in JP-T-2009-537803, a through hole is provided in each of the two wings so that torsion of the same magnitude and opposite directions with respect to the torsion web causes a damping torque of the same magnitude. In addition, the physical quantity sensor has a first electrode below one wing and a second electrode below the other wing, and detects acceleration on the basis of the capacitance between one wing and the first electrode and the capacitance between the other wing and the second electrode.

In addition, for example, JP-A-2007-298405 discloses a physical quantity sensor in which a movable electrode, which is movably supported by a fixed section of a semiconductor layer with a beam section interposed therebetween so as to have asymmetric mass balance and which moves according to the displacement of the physical quantity in a thickness direction of the semiconductor layer, and a fixed electrode, which is formed on a support substrate, are disposed so as to face each other with a gap therebetween. The physical quantity sensor disclosed in JP-A-2007-298405 detects a physical quantity on the basis of the capacitance detected according to the size of the gap between the movable electrode and the fixed electrode.

However, an attempt to reduce the size of the physical quantity sensors disclosed in JP-T-2009-537803 and JP-A-2007-298405 causes a reduction in the electrode area to form the capacitance. For this reason, in order to improve the detection sensitivity without changing the resonant angular frequency, it is necessary to reduce a gap between electrodes (distance between a movable electrode section and a fixed electrode section). However, even if the desired detection sensitivity is obtained by reducing the gap between electrodes, capacitance between the electrodes in a state where acceleration is not applied, that is, initial capacitance tends to increase. An increase in the initial capacitance may become a noise gain to cause a deterioration of the noise characteristic.

SUMMARY

An advantage of some aspects of the invention is to provide a physical quantity sensor that can be miniaturized and can have a good noise characteristic. Another advantage of some aspects of the invention is to provide an electronic apparatus including the above-described physical quantity sensor.

The invention can be implemented as the following forms or application examples.

Application Example 1

This application example is directed to a physical quantity sensor including: a movable body which can be displaced with a first axis as a rotation axis and has first and second sections with the first axis as a boundary in plan view and in which a first movable electrode section is provided in the first section; a beam section which supports the movable body; and a first fixed electrode section disposed so as to face the first movable electrode section. The first fixed electrode section is provided at a position overlapping an end of the first section of the movable body in a direction of a second axis, which is perpendicular to the first axis, in plan view, and is provided in a range of $0.0500X \leq L \leq 0.816X$ assuming that a width of the first section in the second axis direction is X and a width of a portion of the first fixed electrode section in the second axis direction overlapping the movable body in plan view is L.

According to such a physical quantity sensor, it is possible to secure the distance between the first movable electrode section and the first fixed electrode section and also to reduce the capacitance between electrode sections in the initial state (state where acceleration is not applied; for example, a state where the movable body is horizontal) while maintaining the sensitivity. Therefore, it is possible to have a good noise characteristic while realizing miniaturization. In addition, since the distance between electrode sections can be secured, it is possible to prevent the movable electrode section from sticking to the fixed electrode section or the substrate or prevent the Q value from becoming worse.

Application Example 2

In the physical quantity sensor according to the application example, the first fixed electrode section may be provided in a range of $0.164X \leq L \leq 0.633X$.

According to the physical quantity sensor of this configuration, it is possible to secure the distance between the first movable electrode section and the first fixed electrode section and also to reduce the capacitance between electrode sections in the initial state while maintaining the sensitivity.

Application Example 3

In the physical quantity sensor according to the application example, in the movable body, the width of the first section in the direction of the second axis perpendicular to the first axis may be smaller than a width of the second section in the second axis direction.

According to the physical quantity sensor of this configuration, for example, when predetermined acceleration is applied to the movable body, the movable body can be easily tilted to the substrate side. As a result, it is possible to improve the detection sensitivity.

Application Example 4

In the physical quantity sensor according to the application example, a second fixed electrode section may be provided on a substrate so as to face the second section, and a second movable electrode section may be provided in the second section of the movable body.

According to the physical quantity sensor of this configuration, it is possible to detect the physical quantity on the basis of the capacitance between the first movable electrode section and the first fixed electrode section and the capacitance between the second movable electrode section and the second fixed electrode section.

Application Example 5

In the physical quantity sensor according to the application example, a region where the first movable electrode section and the first fixed electrode section overlap each other and a region where the second movable electrode section and the second fixed electrode section overlap each other may be symmetrical with respect to the first axis in plan view.

According to the physical quantity sensor of this configuration, it is possible to detect the physical quantity on the basis of a difference between the capacitance between the first movable electrode section and the first fixed electrode section and the capacitance between the second movable electrode section and the second fixed electrode section.

Application Example 6

In the physical quantity sensor according to the application example, the first fixed electrode section may have a portion protruding from the end in plan view.

According to the physical quantity sensor of this configuration, since it is not necessary to match the end of the first fixed electrode section with the first position of the substrate in plan view, it is possible to facilitate the manufacturing process.

Application Example 7

In the physical quantity sensor according to the application example, the mass of the first section may be smaller than the mass of the second section.

According to the physical quantity sensor of this configuration, since the rotation moment of the first section of the movable body and the rotation moment of the second section of the movable body are not balanced when the acceleration in the vertical direction is applied, for example, it is possible to cause a predetermined inclination in the movable body.

Application Example 8

In the physical quantity sensor according to the application example, the substrate may be formed of an insulating material, and the movable body may be formed of a semiconductor material.

According to the physical quantity sensor of this configuration, since the substrate is formed of an insulating material and the movable body is formed of a semiconductor material, the movable body and the substrate can be easily electrically insulated from each other by bonding the movable body and the substrate to each other. As a result, the sensor structure can be simplified.

Application Example 9

This application example is directed to an electronic apparatus including the physical quantity sensor according to the application example.

Since such an electronic apparatus includes the physical quantity sensor according to the Application Example 1, the electronic apparatus can be miniaturized and can have a good noise characteristic.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. In addition, the embodiments described below are not intended to limit the contents of the invention defined by the appended claims. In addition, all of the configurations described below are not necessarily essential components of the invention.

1. Physical Quantity Sensor

Figure 1:
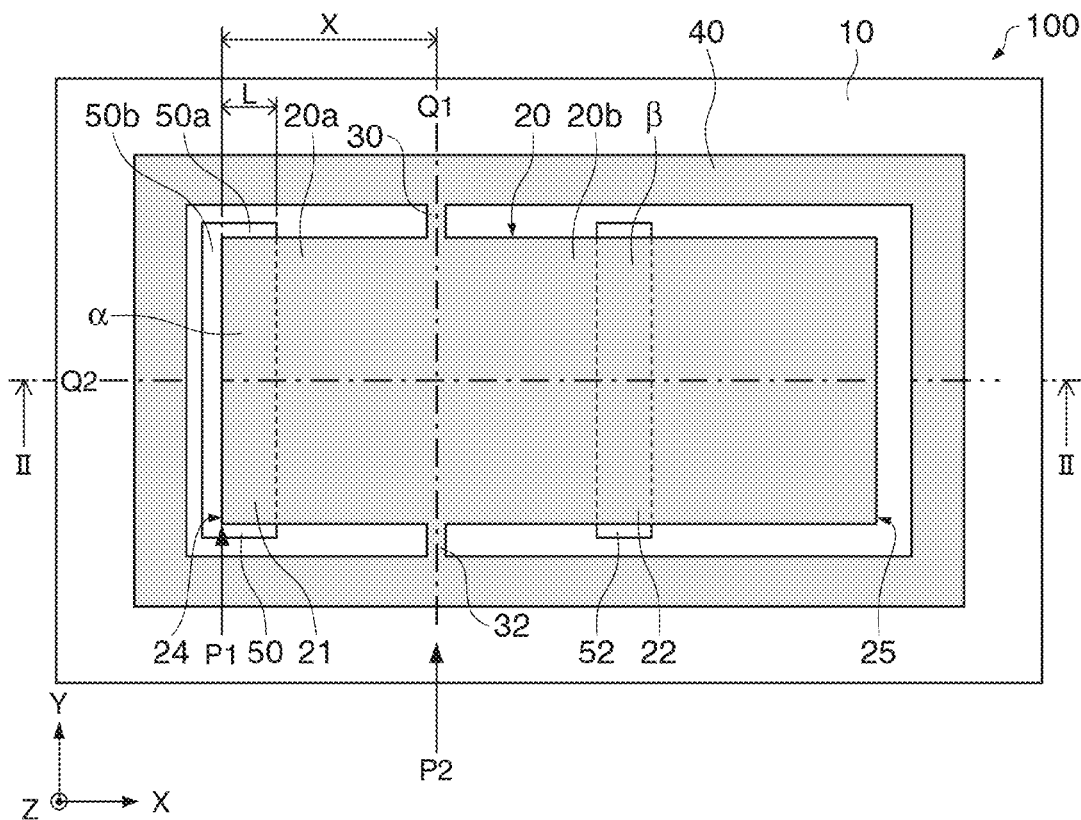
FIG. 1 is a plan view schematically showing a physical quantity sensor according to the embodiment.
Figure 2:
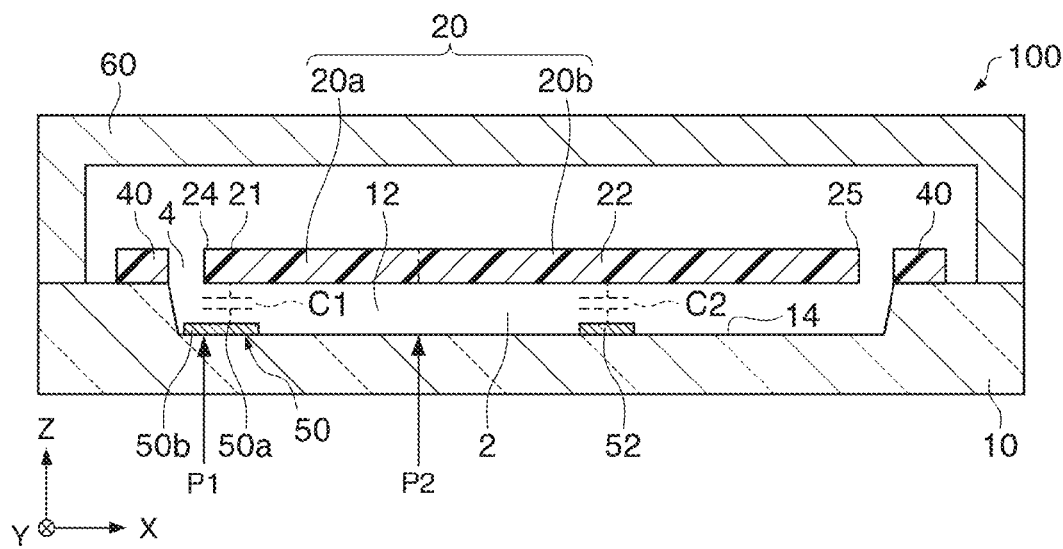
FIG. 2 is a cross-sectional view schematically showing the physical quantity sensor according to the embodiment.

First, a physical quantity sensor according to the embodiment will be described with reference to the accompanying drawings. FIG. 1 is a plan view schematically showing a physical quantity sensor 100 according to the embodiment. FIG. 2 is a cross-sectional view schematically showing the physical quantity sensor 100 according to the embodiment. In addition, FIG. 2 is a cross-sectional view taken along the line II-II of FIG. 1. In addition, for the sake of convenience, a lid 60 is not shown in FIG. 1. In FIGS. 1 and 2, X, Y, and Z axes are shown as three axes perpendicular to each other.

The physical quantity sensor 100 can be used as an inertial sensor. Specifically, the physical quantity sensor 100 can be used as an acceleration sensor (a capacitive acceleration sensor or a capacitive MEMS acceleration sensor) for measuring the acceleration in a vertical direction (Z-axis direction), for example.

As shown in FIGS. 1 and 2, the physical quantity sensor 100 includes a support substrate (substrate) 10, a movable body 20, beam sections 30 and 32, and a first fixed electrode section 50. The physical quantity sensor 100 may further include a fixed section 40, a second fixed electrode section 52, and the lid 60.

The first and second fixed electrode sections 50 and 52 are provided on the support substrate 10. In the example shown in the drawings, the fixed electrode sections 50 and 52 are provided on a surface 14 of the support substrate 10 that defines the bottom surface of a recess 12. The surface 14 of the support substrate 10 on which the fixed electrode sections 50 and 52 are provided is a flat surface. The surface 14 of the support substrate 10 is parallel to the movable body 20 that is in a horizontal state (that is parallel to the XY plane). The fixed section 40 and the lid 60 are bonded to the support substrate 10. It is possible to form a space for housing the movable body 20 using the support substrate 10 and the lid 60. For example, inert gas, such as nitrogen, helium, and argon, is filled into this space. The material of the support substrate 10 is not particularly limited, and is an insulating material, such as glass, for example. For example, by forming the support substrate 10 with an insulating material such as glass and forming the movable body 20 with a semiconductor material such as silicon, the movable body 20 and the support substrate 10 can be easily electrically insulated from each other by bonding the movable body 20 and the support substrate 10 to each other. As a result, the sensor structure can be simplified.

The movable body 20 is provided on the support substrate 10 with a gap 2 therebetween. The movable body 20 is supported by the first and second beam sections 30 and 32. The movable body 20 can be displaced with the first axis Q1 as a rotation axis. Specifically, for example, when the acceleration in the vertical direction (Z-axis direction) is applied, seesaw swing of the movable body 20 is possible with the first axis Q1, which is determined by the beam sections 30 and 32, as a rotation axis (swing axis). The shape of the outer edge of the movable body 20 is a rectangle, for example, in plan view (when viewed from the Z-axis direction). In addition, the thickness of the movable body 20 (size of the movable body 20 in the Z-axis direction) is fixed, for example.

The movable body 20 has a first seesaw piece 20a (first section) and a second seesaw piece 20b (second section). The first seesaw piece 20a is one (in FIG. 1, a section located on the −X-axis direction side) of two sections of the movable body 20 divided by the first axis Q1 in plan view. The second seesaw piece 20b is the other one (in FIG. 1, a section located on the +X-axis direction side) of two sections of the movable body 20 divided by the first axis Q1 in plan view. In the example shown in the drawings, the first seesaw piece 20a extends in the −X-axis direction from the first axis Q1 to an end 24 in a direction of the second axis Q2 (direction along the second axis Q2; in the example shown in the drawings, an X-axis direction). The second seesaw piece 20b extends in the +X-axis direction from the first axis Q1 to an end 25 in the second axis Q2 direction. The first and second seesaw pieces 20a and 20b extend in opposite directions along the second axis Q2 from the first axis Q1. In addition, the second axis Q2 is an axis perpendicular to the first axis Q1 in plan view. In addition, the end 24 of the first seesaw piece 20a is a distal end of the first seesaw piece 20a, and is a section of the first seesaw piece 20a farthest to the first axis Q1. The end 25 of the second seesaw piece 20b is a distal end of the second seesaw piece 20b, and is a section of the second seesaw piece 20b farthest from the first axis Q1.

For example, when the acceleration (for example, acceleration of gravity) in the vertical direction is applied to the movable body 20, rotation moment (moment of force) occurs in each of the first and second seesaw pieces 20a and 20b. Here, when the rotation moment (for example, clockwise rotation moment) of the first seesaw piece 20a and the rotation moment (for example, counterclockwise rotation moment) of the second seesaw piece 20b are balanced, there is no change in the inclination of the movable body 20 and accordingly a change in the acceleration cannot be detected. Therefore, the movable body 20 is designed so that the rotation moment of the first seesaw piece 20a and the rotation moment of the second seesaw piece 20b are not balanced and a predetermined inclination occurs in the movable body 20 when the acceleration in the vertical direction is applied.

In the physical quantity sensor 100, the first and second seesaw pieces 20a and 20b have different mass due to locating the first axis Q1 at a position deviated from the center (center of gravity) of the movable body 20. That is, since the size of the first seesaw piece 20a in the X-axis direction (direction of the second axis Q2) is different from the size of the second seesaw piece 20b in the X-axis direction (direction of the second axis Q2), the mass of the first seesaw piece 20a is different from the mass of the second seesaw piece 20b. In the example shown in the drawings, the distance from the first axis Q1 to the end 24 of the first seesaw piece 20a is smaller than the distance from the first axis Q1 to the end 25 of the second seesaw piece 20b. In addition, the thickness of the first seesaw piece 20a and the thickness of the second seesaw piece 20b are equal. Accordingly, the mass of the first seesaw piece 20a is smaller than the mass of the second seesaw piece 20b. Thus, since the mass of the first seesaw piece 20a is different from the mass of the second seesaw piece 20b, the rotation moment of the first seesaw piece 20a and the rotation moment of the second seesaw piece 20b cannot be balanced when the acceleration in the vertical direction is applied. Therefore, when the acceleration in the vertical direction is applied, a predetermined inclination can be caused in the movable body 20.

The movable body 20 is provided so as to be spaced apart from the support substrate 10. In the example shown in the drawings, the gap 2 is provided between the movable body 20 and the support substrate 10. In addition, the movable body 20 is connected to the fixed section 40 so as to be spaced apart from the fixed section 40 by the beam sections 30 and 32. A gap 4 is provided between the movable body 20 and the fixed section 40. Since the gaps 2 and 4 are present around the movable body 20, seesaw swing of the movable body 20 is possible.

The first movable electrode section 21 is provided in the first seesaw piece 20a. In addition, a second movable electrode section 22 is provided in the second seesaw piece 20b.

In the example shown in the drawings, the first movable electrode section 21 is a section of the movable body 20 overlapping the first fixed electrode section 50 in plan view. The first movable electrode section 21 is a section of the movable body 20 that forms the capacitance C1 together with the first fixed electrode section 50. The second movable electrode section 22 is a section of the movable body 20 overlapping the second fixed electrode section 52 in plan view. The second movable electrode section 22 is a section of the movable body 20 that forms the capacitance C2 together with the second fixed electrode section 52. In the physical quantity sensor 100, the movable electrode sections 21 and 22 may be provided by forming the movable body 20 with a conductive material, or movable electrode sections formed of a conductor layer, such as metal, may be provided on the surface of the movable body 20. In the example shown in the drawings, the movable electrode sections 21 and 22 are provided by forming the movable body 20 with a conductive material (silicon doped with impurities).

The first fixed electrode section 50 is provided at a position of the support substrate 10 facing the first seesaw piece 20a. The capacitance C1 is formed by the first movable electrode section 21 and the first fixed electrode section 50. In addition, the second fixed electrode section 52 is provided at a position of the support substrate 10 facing the second seesaw piece 20b. The capacitance C2 is formed by the second movable electrode section 22 and the second fixed electrode section 52. The capacitance C1 and the capacitance C2 are equal in the initial state, for example. Here, the initial state refers to a state where acceleration is not applied to the physical quantity sensor. For example, the initial state refers to a state where the movable body 20 is horizontal. In the example shown in the drawings, in the initial state, the area of a first region α where the first movable electrode section 21 and the first fixed electrode section 50 overlap each other in plan view is equal to the area of a second region β where the second movable electrode section 22 and the second fixed electrode section 52 overlap each other in plan view. In addition, the distance between the first movable electrode section 21 and the first fixed electrode section 50 is equal to the distance between the second movable electrode section 22 and the second fixed electrode section 52. Accordingly, the capacitance C1 (initial capacitance) in the initial state is equal to the capacitance C2 (initial capacitance) in the initial state. The positions of the first and second movable electrode sections 21 and 22 change according to the movement of the movable body 20. The capacitance C1 and the capacitance C2 change according to the change in the positions of the movable electrode sections 21 and 22. A predetermined electric potential is applied to the movable body 20 through the beam sections 30 and 32, for example.

The first and second beam sections 30 and 32 support the movable body 20 so as to be able to be displaced around the first axis Q1. The beam sections 30 and 32 can function as torsion springs. Therefore, since the movable body 20 has a strong restoring force against torsional deformation that occurs in the beam sections 30 and 32 due to the rotation (seesaw swing) of the movable body 20 around the first axis Q1 as a rotation axis, it is possible to prevent the beam sections 30 and 32 from being damaged.

The first and second beam sections 30 and 32 are disposed on the first axis Q1 in plan view, as shown in FIG. 1. The beam sections 30 and 32 extend on the first axis Q1 from the fixed section 40 to the movable body 20. The beam sections 30 and 32 are members that determine the position of the first axis Q1 serving as the rotation axis (swing axis) of the movable body 20. The beam sections 30 and 32 connect the fixed section 40 and the movable body 20 to each other. The first beam section 30 is connected to the +Y-axis-direction side surface of the movable body 20, and the second beam section 32 is connected to the −Y-axis-direction side surface of the movable body 20.

The fixed section 40 is fixed to the support substrate 10. The fixed section 40 is provided around the movable body 20 in plan view. In the example shown in the drawings, the fixed section 40 is provided so as to surround the movable body 20 in plan view. In addition, the shape of the fixed section 40 is not particularly limited. The fixed section 40 and the movable body 20 are spaced apart from each other, and the gap 4 is provided between the fixed section 40 and the movable body 20.

The movable body 20, the beam sections 30 and 32, and the fixed section 40 are integrally provided. The movable body 20, the beam sections 30 and 32, and the fixed section 40 are integrally provided by patterning one substrate (for example, a silicon substrate).

The first fixed electrode section 50 is provided on the support substrate 10. The first fixed electrode section 50 is disposed at a position facing the first movable electrode section 21 (first seesaw piece 20a). The first movable electrode section 21 is located above the first fixed electrode section 50 with the gap 2 therebetween. The first fixed electrode section 50 is provided so as to form the capacitance C1 between the first fixed electrode section 50 and the first movable electrode section 21. The first fixed electrode section 50 is provided at a position overlapping the end 24 of the first seesaw piece 20a in a direction of the second axis Q2. The first fixed electrode section 50 has a first extension 50a, which extends from a first position P1 of the support substrate 10 in the +X-axis direction, and a second extension 50b, which extends from a second position P2 of the support substrate 10 in the −X-axis direction. That is, the first extension 50a is located on one side (+X-axis direction side or the first axis Q1 side) of the first position P1, and the second extension 50b is located on the other side of the first position P1. Here, the first position P1 of the support substrate 10 is a position of the support substrate 10 overlapping the end 24 of the first seesaw piece 20a in plan view. In addition, the second position P2 of the support substrate 10 is a position of the support substrate 10 overlapping the first axis Q1.

The first extension 50a of the first fixed electrode section 50 includes a portion that faces the first movable electrode section 21 to form the capacitance C1. The first extension 50a includes a portion overlapping the movable body 20 in plan view. The first extension 50a extends in the +X-axis direction from the first position P1 of the support substrate 10 toward the second position P2 of the support substrate 10. In addition, the second extension 50b of the first fixed electrode section 50 extends from the first position P1 of the support substrate 10 in a direction opposite the extension direction of the first extension 50a (opposite direction to the direction from the first position P1 of the support substrate 10 toward the second position P2 of the support substrate 10). The second extension 50b of the first fixed electrode section 50 includes a portion protruding from the end 24 of the first seesaw piece 20a in plan view. The second extension 50b of the first fixed electrode section 50 does not face the first movable electrode section 21, and is located outside the outer edge of the first movable electrode section 21.

In addition, although not shown in the drawings, the first fixed electrode section 50 does not necessarily need to include the second extension 50b. That is, the first fixed electrode section 50 may be formed to include only the first extension 50a. In this case, the first fixed electrode section 50 and the second fixed electrode section 52 are provided symmetrically with respect to the first axis Q1 in plan view.

The second fixed electrode section 52 is provided on the support substrate 10. The second fixed electrode section 52 is disposed at a position facing the second seesaw piece 20b. The second movable electrode section 22 is located above the second fixed electrode section 52 with a gap therebetween. The second fixed electrode section 52 is provided so as to form the capacitance C2 between the second fixed electrode section 52 and the second movable electrode section 22.

As shown in FIG. 1, the first region α where the first movable electrode section 21 and the first fixed electrode section 50 overlap each other and the second region β where the second movable electrode section 22 and the second fixed electrode section 52 overlap each other are symmetrical with respect to the first axis Q1 in plan view. That is, the first and second regions α and β have the same planar shape, and distances of the first and second regions α and β from the first axis Q1 are equal. In the example shown in the drawings, the first extension 50a of the first fixed electrode section 50 and the second fixed electrode section 52 are provided symmetrically with respect to the first axis Q1 in plan view. That is, the first extension 50a of the first fixed electrode section 50 and the second fixed electrode section 52 have the same planar shape, and are disposed at positions of which distances from the first axis Q1 are equal.

The first fixed electrode section 50 is provided at a position overlapping the end 24 of the first seesaw piece 20a in a direction of the second axis Q2 (X-axis direction) in plan view, and is provided in a range of 0.0500X≤L≤0.816X assuming that the width of the first seesaw piece 20a in a direction of the second axis Q2 (X-axis direction) is X and the width of a portion of the first fixed electrode section 50 in a direction of the second axis Q2 overlapping the movable body 20 in plan view is L. In this manner, it is possible to secure the distance between the first movable electrode section 21 and the first fixed electrode section 50 and also to reduce the capacitance C1 in the initial state while maintaining the sensitivity. In addition, in the example shown in the drawings, the width L is a width (size in the X-axis direction) of the first extension 50a of the first fixed electrode section 50. In addition, the width L is equal to the distance between the first position P1 of the support substrate 10 and the end of the fixed electrode section 50 in the +X-axis direction. In addition, since the width L is in a range of 0.164X≤L≤0.633X, it is possible to secure the distance between the first movable electrode section 21 and the first fixed electrode section 50 and also to reduce the capacitance C1 in the initial state while maintaining the sensitivity. Hereinafter, the reason will be described.

Figure 3A:
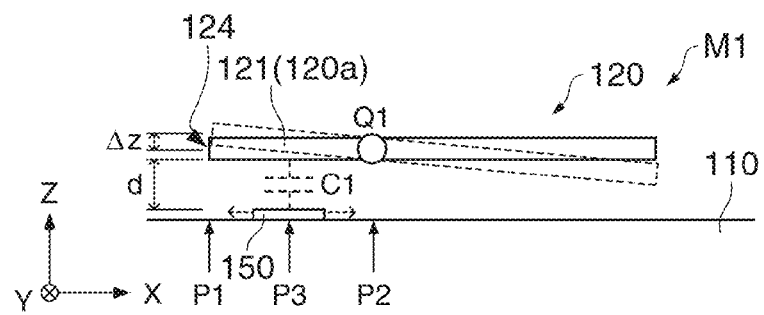
FIGS. 3A and 3B are schematic diagrams showing the model of a physical quantity sensor for explaining the width of a portion of a first fixed electrode section overlapping a movable body.
Figure 3B:
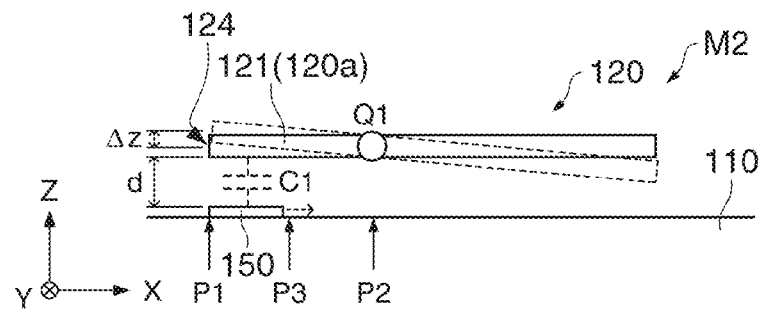

FIGS. 3A and 3B are diagrams showing the model of a physical quantity sensor for explaining the range of the width L of a portion of the first fixed electrode section 50 overlapping the movable body 20. FIG. 3A is a cross-sectional view schematically showing a model M1. FIG. 3B is a cross-sectional view schematically showing a model M2.

In the models M1 and M2, the initial capacitance $C_0$ between a movable electrode section 121 and a fixed electrode section 150 is expressed as in the following expression (1). In addition, the initial capacitance $C_0$ is the capacitance C1 in a state where a movable body 120 is horizontal, and is the capacitance C1 in a state where acceleration is not applied.

$$C_0 = \varepsilon \frac{S}{d} \quad (1)$$

Here, $\varepsilon$ is a dielectric constant of the dielectric between the electrode sections 121 and 150. S is an opposing area of the electrode sections 121 and 150 (the area of a region where the electrode sections 121 and 150 overlap each other in plan view). d is a distance (gap) between the electrode sections 121 and 150 in the initial state.

In addition, the sensitivity ΔC of the physical quantity sensor is expressed as in the following expression (2).

$$\Delta C = \frac{C_0}{d \times \omega_0^2} = \frac{C_0 \times \Delta d}{d} \quad (2)$$

Here, $\omega_0$ indicates resonant angular frequency, and Δd indicates the magnitude of the displacement of the movable electrode section 121 in the Z-axis direction. Specifically, Δd is the magnitude of the displacement of the movable electrode section 121 in the Z-axis direction when an end 124 of a first seesaw piece 120a of the movable body 120 is displaced by Δz in the Z-axis direction.

From expressions (1) and (2), it can be seen that it is necessary to reduce the opposing area S of the electrode sections 121 and 150 and also to reduce the gap d between the electrode sections 121 and 150 in order to reduce the initial capacitance $C_0$ while maintaining the sensitivity ΔC constant.

Here, for the models M1 and M2, the relationship between the area ratio and the initial capacitance $C_0$ and the relationship between the area ratio and the inter-electrode gap d, by which the sensitivity ΔC is constant, are calculated from expression (2). In addition, the area ratio is a ratio of the opposing area S of the electrode sections 121 and 150 to the entire area of the first seesaw piece 120a. For example, the case where the area ratio is 1 is a case where the width of the fixed electrode section 150 is from the first position P1 to the second position P2, that is, a case where the fixed electrode section 150 extends from the first position P1 to the second position P2. In addition, the initial capacitance $C_0$ ratio is obtained by normalizing the initial capacitance $C_0$ in each area ratio with respect to the initial capacitance $C_0$ when the area ratio is 1. In addition, the inter-electrode gap d ratio is obtained by normalizing the distance (gap) d between the electrode sections 121 and 150 in each area ratio with respect to the distance (gap) d between the electrode sections 121 and 150 when the area ratio is 1.

In the model M1, the position of the center of the fixed electrode section 150 is fixed to the third position P3 (middle position between the first and second positions P1 and P2) of a support substrate 110 overlapping the center of the first seesaw piece 20a and the width (size in the X-axis direction) of the fixed electrode section 150 is changed, thereby changing the opposing area S of the electrode sections 121 and 150. Therefore, calculation is performed on the assumption that the displacement Δd of the movable electrode section 121 is fixed even if the opposing area S of the electrode sections 121 and 150 is changed in expressions (1) and (2). In addition, the length (size in the Y-axis direction) of the fixed electrode section 150 is fixed.

Figure 4:
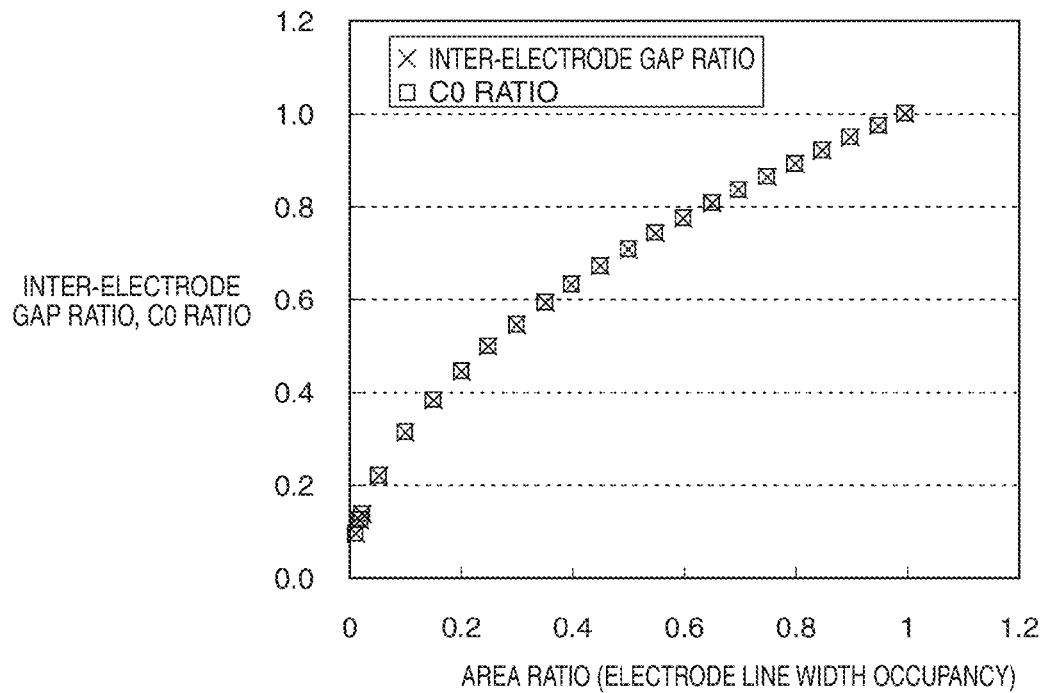
FIG. 4 is a graph showing the relationship between the area ratio and the initial capacitance and the relationship between the area ratio and the inter-electrode gap, by which the sensitivity is constant, in a model M1.

FIG. 4 is a graph showing the relationship between the area ratio and the initial capacitance $C_0$ and the relationship between the area ratio and the inter-electrode gap d, by which the sensitivity ΔC is constant, in the model M1. As shown in FIG. 4, in the model M1, if the area ratio decreases while maintaining the sensitivity ΔC constant, the initial capacitance $C_0$ ratio and the inter-electrode gap d ratio decrease with the same trend. Therefore, if the initial capacitance $C_0$ is reduced while maintaining the sensitivity ΔC constant, the gap d between the electrode sections 121 and 150 is reduced. If the gap d between the electrode sections 121 and 150 is reduced, the movable electrode section 121 may stick to the fixed electrode section 150 or the support substrate 110, or the Q value which is a mechanical characteristic may become worse.

In the model M2, the end of the fixed electrode section 150 is fixed to the first position P1 and the width of the fixed electrode section 150 in the X-axis direction is changed by extending the fixed electrode section 150 from the first position P1 toward the second position P2, thereby changing the opposing area S of the electrode sections 121 and 150. That is, in expression (2), the magnitude Δd of the displacement of the movable electrode section 121 is Δd=(−0.5×electrode line width occupancy+1)×Δz. Here, the electrode line width occupancy is obtained by normalizing the width of the fixed electrode section 150 in the X-axis direction with respect to the distance between the first and second positions P1 and P2. For example, the electrode line width occupancy is 0.5 when the fixed electrode section 150 extends from the first position P1 to the third position P3, and the electrode line width occupancy is 1 when the fixed electrode section 150 extends from the first position P1 to the second position P2. In addition, the length (size in the Y-axis direction) of the fixed electrode section 150 is fixed. Therefore, in FIG. 4 and FIG. 5, the area ratio can be replaced with the electrode line width occupancy.

Figure 5:
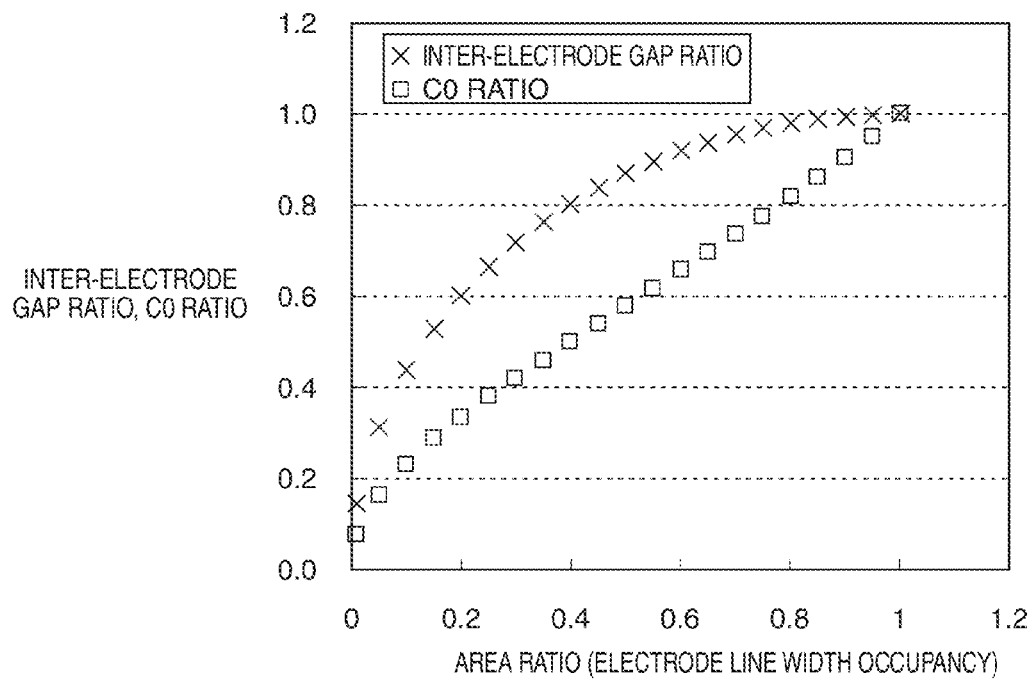
FIG. 5 is a graph showing the relationship between the area ratio and the initial capacitance and the relationship between the area ratio and the inter-electrode gap, by which the sensitivity is constant, in a model M2.

FIG. 5 is a graph showing the relationship between the area ratio and the initial capacitance $C_0$ and the relationship between the area ratio and the inter-electrode gap d, by which the sensitivity ΔC is constant, in the model M2. As shown in FIG. 5, in the model M2, the percentage reduction in the inter-electrode gap d according to a reduction in the initial capacitance $C_0$ ratio is small, compared with model M1. That is, in the model M2, even if the initial capacitance $C_0$ is set to be small compared with the model M1 while maintaining the sensitivity ΔC, it is possible to increase the gap d between the electrode sections 121 and 150 in the initial state.

Figure 6:
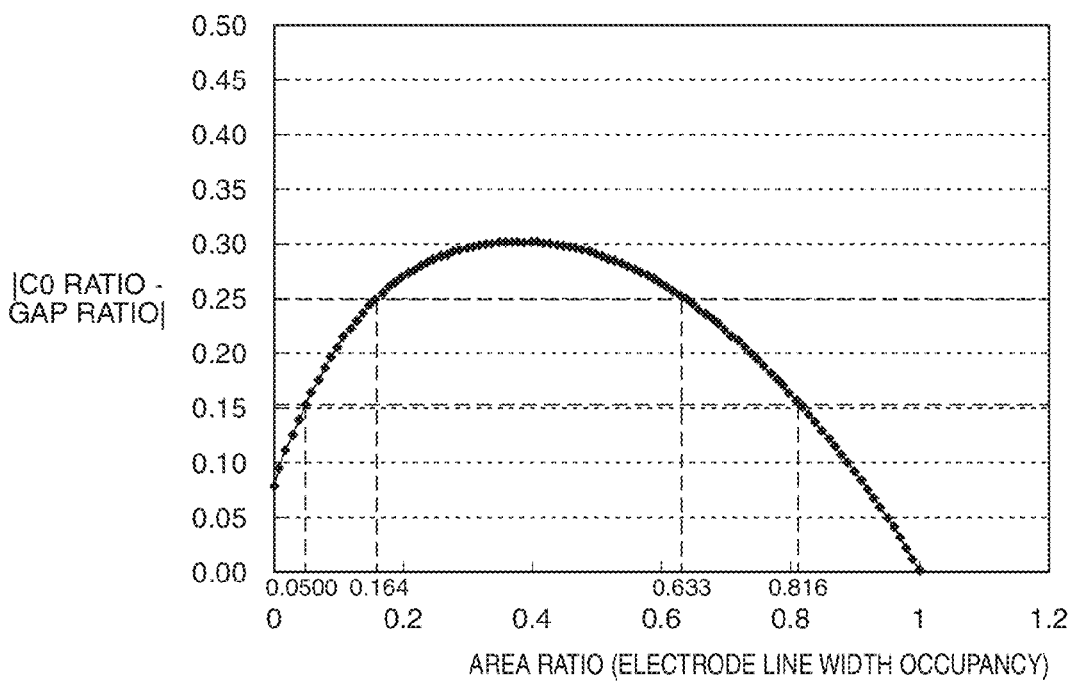
FIG. 6 is a graph showing the relationship between the area ratio and a difference between the initial capacitance and the inter-electrode gap ratio, by which the sensitivity is constant, in the model M2.

FIG. 6 is a graph showing the relationship between the area ratio and a difference between the initial capacitance $C_0$ ratio and the inter-electrode gap d ratio (|initial capacitance $C_0$ ratio−inter-electrode gap d ratio|), by which the sensitivity ΔC is constant, in the model M2. From the graph shown in FIG. 6, it can be seen that, in the model M2, assuming that the electrode line width occupancy (area ratio) is L1, the difference between the initial capacitance $C_0$ ratio and the inter-electrode gap d ratio is equal to or greater than 0.15 in a range of 0.0500≤L1≤0.816. If the difference between the initial capacitance $C_0$ ratio and the inter-electrode gap d ratio is equal to or greater than 0.15, it is possible to secure the distance between electrode sections and also to reduce the initial capacitance while maintaining the sensitivity ΔC. In addition, if the area ratio is smaller than 0.0500, the fixed electrode section becomes too small. In this case, it is difficult to manufacture the fixed electrode section. If the electrode line width occupancy (area ratio) L1 is equal to or greater than 0.0500, the fixed electrode section can be easily manufactured. In addition, from the graph shown in FIG. 6, it can be seen that, in the model M2, the difference between the initial capacitance $C_0$ ratio and the inter-electrode gap d ratio is equal to or greater than 0.2 when the electrode line width occupancy (area ratio) L1 is in a range of 0.164≤L1≤0.633. If the difference between the initial capacitance $C_0$ ratio and the inter-electrode gap d ratio is equal to or greater than 0.2, it is possible to secure the distance between electrode sections and also to make the initial capacitance smaller while maintaining the sensitivity ΔC. In addition, from the graph shown in FIG. 6, it can be seen that, in the model M2, the difference between the initial capacitance $C_0$ ratio and the inter-electrode gap d ratio is largest when the electrode line width occupancy (area ratio) L1 is 0.380. For this reason, by setting the electrode line width occupancy (area ratio) L1 to 0.380, it is possible to secure the distance between the movable electrode section and the fixed electrode section more reliably and also to reduce the initial capacitance while maintaining the sensitivity. In addition, in the physical quantity sensor 100 shown in FIGS. 1 and 2, the electrode line width occupancy (area ratio) L1 in the model M2 is equivalent to the width L of a portion of the first fixed electrode section 50 in a direction of the second axis Q2 overlapping the movable body 20 in plan view.

From the above-described result, in the physical quantity sensor 100, since the first fixed electrode section 50 is provided at a position overlapping the end 24 of the first seesaw piece 20a in a direction of the second axis Q2 (X-axis direction) in plan view and is also provided in the range of 0.0500X≤L≤0.816X assuming that the width of the first seesaw piece 20a in a direction of the second axis Q2 is X and the width of a portion of the first fixed electrode section 50 in a direction of the second axis Q2 overlapping the movable body 20 in plan view is L, it is possible to secure the distance between the first movable electrode section 21 and the first fixed electrode section 50 and also to reduce the capacitance C1 in the initial state while maintaining the sensitivity. In addition, since the width L of a portion of the first fixed electrode section 50 in a direction of the second axis Q2 overlapping the movable body 20 in plan view is in a range of 0.164X≤L≤0.633X, it is possible to secure the distance between the first movable electrode section 21 and the first fixed electrode section 50 and also to make the capacitance C1 in the initial state smaller while maintaining the sensitivity. In addition, since the width L of a portion of the first fixed electrode section 50 in a direction of the second axis Q2 overlapping the movable body 20 in plan view is L=0.380, it is possible to secure the distance between the first movable electrode section 21 and the first fixed electrode section 50 more reliably and also to reduce the capacitance C1 in the initial state while maintaining the sensitivity.

Materials of the fixed electrode sections 50 and 52 are aluminum, gold, and ITO (Indium Tin Oxide), for example. Preferably, the materials of the fixed electrode sections 50 and 52 are transparent electrode materials, such as ITO. This is because foreign matter or the like present on the fixed electrode section 50 and 52 can be easily viewed when the support substrate 10 is a transparent substrate (glass substrate) due to using a transparent electrode material as the fixed electrode sections 50 and 52.

The lid 60 is placed on the support substrate 10. As the lid 60, for example, a silicon substrate (substrate formed of silicon) may be used. When a glass substrate is used as the support substrate 10, the support substrate 10 and the lid 60 may be bonded to each other by anodic bonding.

Next, the operation of the physical quantity sensor 100 will be described. In the physical quantity sensor 100, the movable body 20 swings (rotates) around the first axis Q1 according to the physical quantity, such as acceleration or angular velocity. The distance between the first movable electrode section 21 and the first fixed electrode section 50 and the distance between the second movable electrode section 22 and the second fixed electrode section 52 change with the movement of the movable body 20. Specifically, one of the distance between the electrode sections 21 and 50 and the distance between the electrode sections 22 and 52 is increased, and the other distance is reduced. For this reason, one of the capacitance C1 and the capacitance C2 is increased and the other capacitance is reduced due to the swing (rotation) of the movable body 20. Accordingly, a physical quantity, such as acceleration or angular velocity, can be detected on the basis of the difference between the capacitance C1 and the capacitance C2 (by differential detection).

As described above, the physical quantity sensor 100 can be used as an inertial sensor, such as an acceleration sensor or a gyro sensor. Specifically, the physical quantity sensor 100 can be used as a capacitance acceleration sensor for measuring the acceleration in a vertical direction, for example.

The physical quantity sensor 100 according to the embodiment has the following features, for example.

In the physical quantity sensor 100, the first fixed electrode section 50 is provided at a position overlapping the end 24 of the first seesaw piece 20a in a direction of the second axis Q2 (X-axis direction) in plan view, and is provided in a range of 0.0500X≤L≤0.816X assuming that the width of the first seesaw piece 20a in a direction of the second axis Q2 is X and the width of a portion of the first fixed electrode section 50 in a direction of the second axis Q2 overlapping the movable body 20 in plan view is L. In this manner, as described above, it is possible to secure the distance between the first movable electrode section 21 and the first fixed electrode section 50 and also to reduce the capacitance C1 in the initial state while maintaining the sensitivity. Therefore, it is possible to have a good noise characteristic while realizing miniaturization. In addition, since the distance between the electrode sections 21 and 50 can be secured, it is possible to prevent the movable electrode section from sticking to the fixed electrode section or the support substrate or prevent the Q value from becoming worse.

For example, an attempt to reduce the size of the physical quantity sensor causes a reduction in the electrode area to form the capacitance. For this reason, in order to improve the detection sensitivity without changing the resonance frequency, it is necessary to reduce a gap between electrodes (size of a gap between a movable electrode section and a fixed electrode section). However, even if the desired detection sensitivity is obtained by reducing the gap between electrodes, the initial capacitance tends to increase. An increase in the initial capacitance may become a noise gain to cause a deterioration of the noise characteristic. In addition, a reduction in the gap between electrodes may cause the sticking of the electrode section or the deterioration of the Q value in the manufacturing process, for example. According to the physical quantity sensor 100, since it is possible to secure the distance between the first movable electrode section 21 and the first fixed electrode section 50 and also to reduce the capacitance C1 in the initial state while maintaining the sensitivity, it is possible to have a good noise characteristic while realizing miniaturization. In addition, it is possible to prevent the sticking of the electrode section or the deterioration of the Q value.

In addition, in the physical quantity sensor 100, the width L of a portion of the first fixed electrode section 50 in a direction of the second axis Q2 overlapping the movable body 20 in plan view can be set within the range of $0.164X \leq L \leq 0.633X$. In this manner, since it is possible to secure the distance between the first movable electrode section 21 and the first fixed electrode section 50 and also to make the capacitance C1 in the initial state smaller while maintaining the sensitivity, it is possible to have a better noise characteristic while realizing miniaturization.

In the physical quantity sensor 100, the second fixed electrode section 52 disposed so as to face the second seesaw piece 20b is provided on the support substrate 10, and the second movable electrode section 22 is provided in the second seesaw piece 20b. Therefore, it is possible to detect the physical quantity on the basis of the capacitance C1 between the first movable electrode section 21 and the first fixed electrode section 50 and the capacitance C2 between the second movable electrode section 22 and the second fixed electrode section 52.

In the physical quantity sensor 100, the first region α where the first movable electrode section 21 and the first fixed electrode section 50 overlap each other and the second region β where the second movable electrode section 22 and the second fixed electrode section 52 overlap each other are symmetrical with respect to the first axis Q1 in plan view. Accordingly, since the amount of change in the capacitance C1 and the amount of change in the capacitance C2 can be made to be the same when the movable body 20 is inclined, a physical quantity, such as acceleration or angular velocity, can be easily detected on the basis of the difference between the capacitance C1 and the capacitance C2.

In the physical quantity sensor 100, the first fixed electrode section 50 has the second extension 50b protruding from the end 24 of the first seesaw piece 20a in plan view. Accordingly, since it is not necessary to match the end of the first fixed electrode section 50 with the first position P1 of the support substrate 10 in plan view, it is possible to facilitate the manufacturing process.

In the physical quantity sensor 100, the mass of the first seesaw piece 20a is smaller than the mass of the second seesaw piece 20b. Accordingly, since the rotation moment of one side (first seesaw piece 20a) of the movable body 20 and the rotation moment of the other side (second seesaw piece 20b) of the movable body 20 are not balanced when the acceleration in the vertical direction is applied, for example, it is possible to cause a predetermined inclination in the movable body.

According to the physical quantity sensor 100, since the support substrate 10 is formed of an insulating material and the movable body 20 is formed of a semiconductor material, the movable body 20 and the support substrate 10 can be easily electrically insulated from each other by bonding the movable body 20 and the support substrate 10 to each other. As a result, the sensor structure can be simplified.

2. Method of Manufacturing a Physical Quantity Sensor

Figure 7:
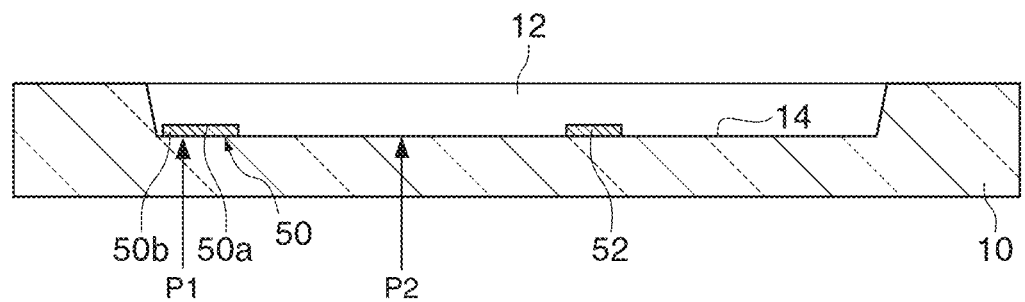
FIG. 7 is a cross-sectional view schematically showing the process of manufacturing the physical quantity sensor according to the embodiment.
Figure 8:
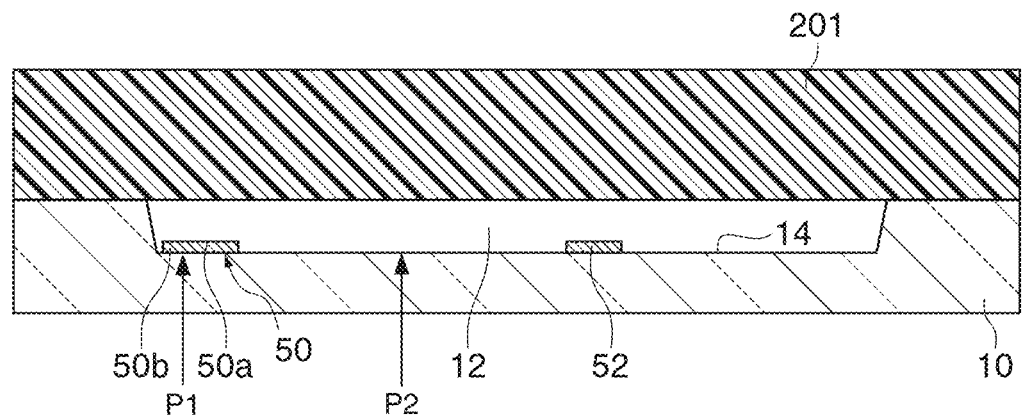
FIG. 8 is a cross-sectional view schematically showing the process of manufacturing the physical quantity sensor according to the embodiment.
Figure 9:
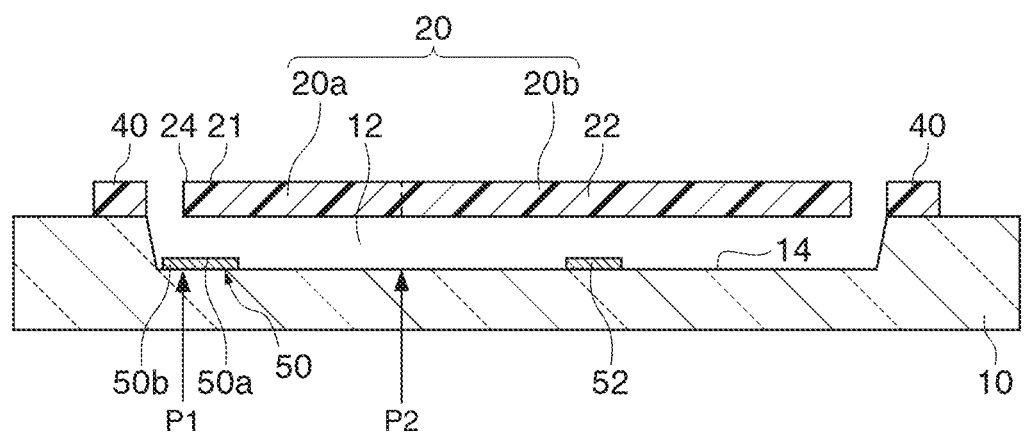
FIG. 9 is a cross-sectional view schematically showing the process of manufacturing the physical quantity sensor according to the embodiment.

Next, a method of manufacturing the physical quantity sensor according to the embodiment will be described with reference to the accompanying drawings. FIGS. 7 to 9 are cross-sectional views schematically showing a method of manufacturing the physical quantity sensor 100 according to the embodiment.

As shown in FIG. 7, for example, a glass substrate is etched to form the recess 12 in a glass substrate, thereby obtaining the support substrate 10. As the etching, for example, wet etching is performed.

Then, the first and second fixed electrode sections 50 and 52 are formed on the surface 14 of the support substrate 10 that defines the bottom surface of the recess 12. The fixed electrode sections 50 and 52 are formed by forming a conductive layer on the surface 14 of the support substrate 10 using a sputtering method or the like and then patterning the conductive layer using a photolithographic technique and an etching technique. The first fixed electrode section 50 is formed such that the width L of a portion of the first fixed electrode section 50 in a direction of the second axis Q2 overlapping the movable body 20 in plan view is within the range of $0.0500 \leq L \leq 0.816$, for example.

As shown in FIG. 8, a silicon substrate 201 (sensor substrate) is bonded to the support substrate 10. The support substrate 10 and the silicon substrate 201 are bonded to each other using anodic bonding or direct bonding or using an adhesive, for example.

As shown in FIG. 9, the movable body 20, the beam sections 30 and 32, and the fixed section 40 are formed by making the silicon substrate 201 thin by grinding using a grinding machine and then patterning the silicon substrate 201 in a desired shape. In the movable body 20, the end 24 of the first seesaw piece 20a is formed above the first position P1. In addition, the beam sections 30 and 32 are formed above the second position P2. Patterning is performed using a photolithographic technique or an etching technique (dry etching). As a more specific etching technique, a Bosch method can be used. In this process, the movable body 20, the beam sections 30 and 32, and the fixed section 40 are integrally formed by patterning (etching) the silicon substrate 201.

As shown in FIGS. 1 and 2, the lid 60 is bonded to the support substrate 10, and the movable body 20 is housed in the space formed by the support substrate 10 and the lid 60. The support substrate 10 and the lid 60 are bonded to each other using anodic bonding or using an adhesive, for example.

By performing this process in an inert gas atmosphere, it is possible to fill inert gas into the space where the movable body 20 is housed.

Through the above process, the physical quantity sensor 100 can be manufactured.

3. Electronic Apparatus

Next, an electronic apparatus according to the embodiment will be described with reference to the accompanying drawings. The electronic apparatus according to the embodiment includes the physical quantity sensor according to the embodiment of the invention. Hereinafter, an electronic apparatus including the physical quantity sensor 100 will be described as the physical quantity sensor according to the embodiment of the invention.

Figure 10:
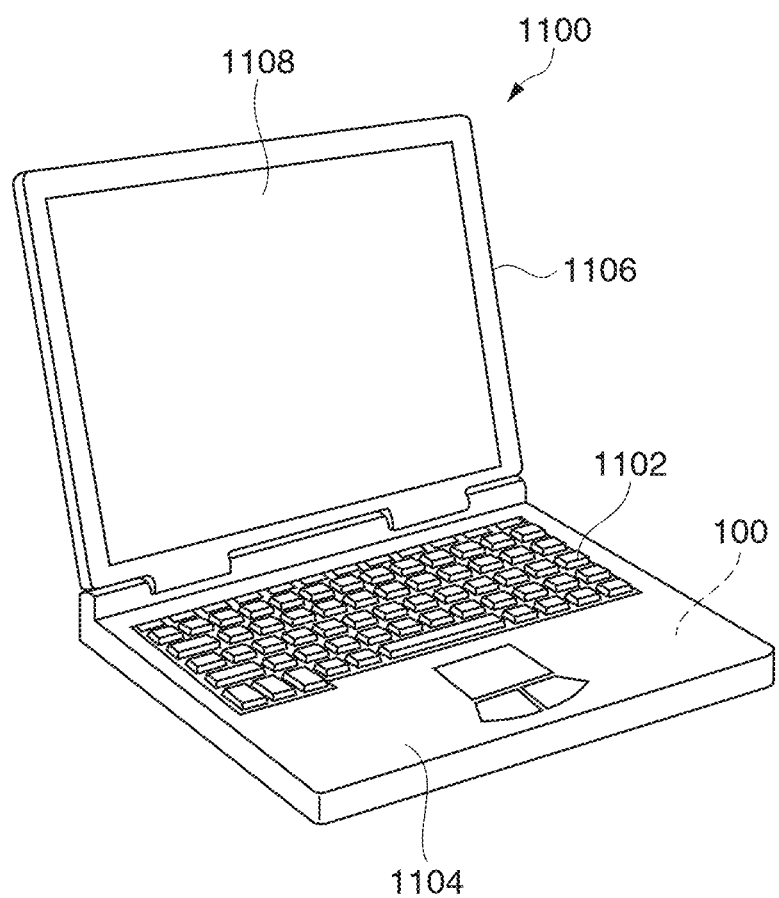
FIG. 10 is a perspective view schematically showing an electronic apparatus according to the embodiment.

FIG. 10 is a perspective view schematically showing a mobile (or notebook) personal computer 1100 as the electronic apparatus according to the embodiment.

As shown in FIG. 10, the personal computer 1100 is configured to include a main body 1104 having a keyboard 1102 and a display unit 1106 having a display section 1108, and the display unit 1106 is supported so as to be rotatable with respect to the main body 1104 through a hinge structure.

The physical quantity sensor 100 is built in such a personal computer 1100.

Figure 11:
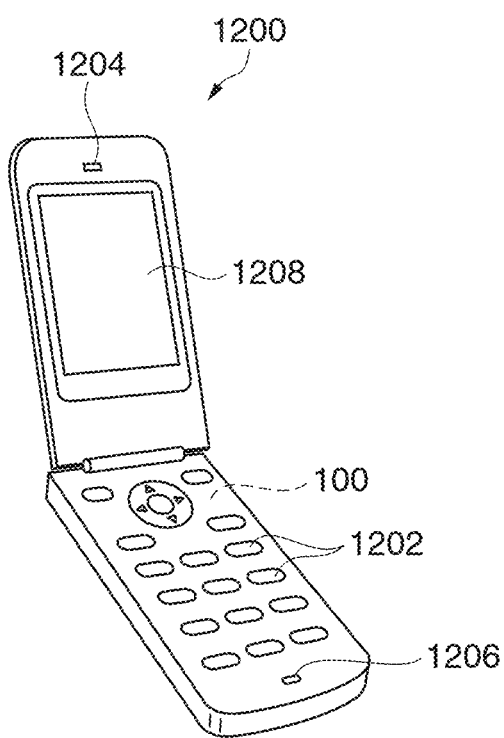
FIG. 11 is a perspective view schematically showing an electronic apparatus according to the embodiment.

FIG. 11 is a perspective view schematically showing a mobile phone (including a PHS) 1200 as the electronic apparatus according to the embodiment.

As shown in FIG. 11, the mobile phone 1200 includes a plurality of operation buttons 1202, an earpiece 1204, and a speaker 1206, and a display unit 1208 is disposed between the operation buttons 1202 and the earpiece 1204.

The physical quantity sensor 100 is built in such a mobile phone 1200.

Figure 12:
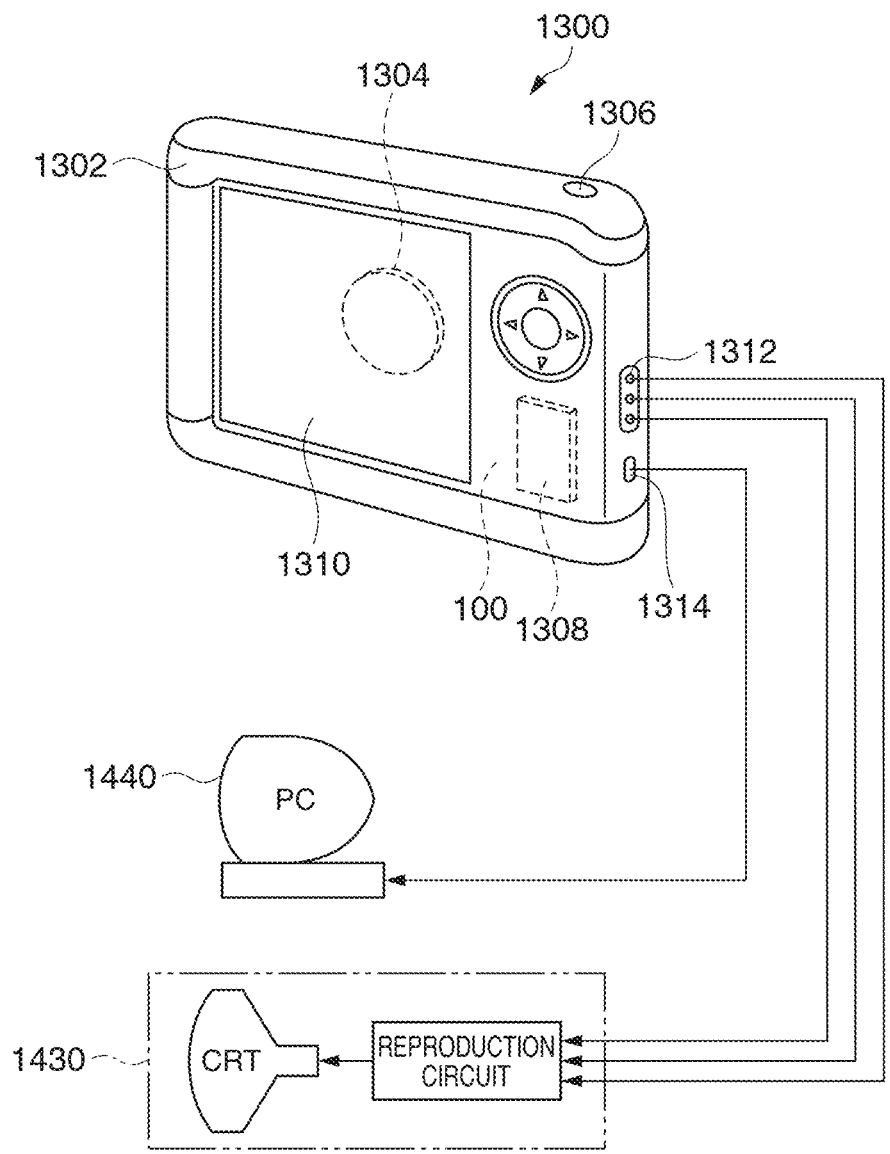
FIG. 12 is a perspective view schematically showing an electronic apparatus according to the embodiment.

FIG. 12 is a perspective view schematically showing a digital still camera 1300 as the electronic apparatus according to the embodiment. In addition, FIG. 12 also simply shows a connection with an external apparatus.

Here, while a silver halide photograph film is exposed to light according to an optical image of a subject in a typical camera, the digital still camera 1300 generates an imaging signal (image signal) by performing photoelectric conversion of an optical image of a subject using an imaging element, such as a CCD (Charge Coupled Device).

A display unit 1310 is provided on the back of a case (body) 1302 in the digital still camera 1300, so that display based on the imaging signal of the CCD is performed. The display unit 1310 functions as a viewfinder that displays a subject as an electronic image.

In addition, a light receiving unit 1304 including an optical lens (imaging optical system), a CCD, and the like is provided on the front side (back side in the drawing) of the case 1302.

When a photographer checks a subject image displayed on the display unit 1310 and presses a shutter button 1306, an imaging signal of the CCD at that time is transferred and stored in a memory 1308.

In addition, in this digital still camera 1300, a video signal output terminal 1312 and an input and output terminal for data communication 1314 are provided on the side of the case 1302. In addition, a television monitor 1430 is connected to the video signal output terminal 1312 and a personal computer 1440 is connected to the input and output terminal for data communication 1314 when necessary. In addition, an imaging signal stored in the memory 1308 may be output to the television monitor 1430 or the personal computer 1440 through a predetermined operation.

The physical quantity sensor 100 is provided in such a digital still camera 1300.

Each of the above-described electronic apparatuses 1100, 1200, and 1300 includes the physical quantity sensor 100 that can be miniaturized and can have a good noise characteristic. Therefore, the electronic apparatuses 1100, 1200, and 1300 can be miniaturized and can have a good noise characteristic.

In addition, examples of the electronic apparatus including the above-described physical quantity sensor 100 include not only the personal computer (mobile personal computer) shown in FIG. 10, the mobile phone shown in FIG. 11, and the digital still camera shown in FIG. 12 but also an ink jet type discharge apparatus (for example, an ink jet printer), a laptop type personal computer, a television, a video camera, a video tape recorder, various navigation apparatuses, a pager, an electronic diary (electronic diary with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), and a flight simulator.

The invention includes substantially the same configuration (for example, a configuration with the same function, method, and result or a configuration with the same object and effect) as the configuration described in the embodiment. In addition, the invention includes a configuration that replaces a section that is not essential in the configuration described in the embodiment. In addition, the invention includes a configuration capable of achieving the same operation and effect as in the configuration described in the embodiment or a configuration capable of achieving the same object. In addition, the invention includes a configuration in which a known technique is applied to the configuration described in the embodiment.

The entire disclosure of Japanese Patent Application No. 2012-088607, filed Apr. 9, 2012 is expressly incorporated by reference herein.

What is claimed is:

1. A physical quantity sensor comprising:
   a movable body that has a first axis as a rotation axis in a first direction, that has first and second edges extending in the first direction and that is divided into first and second areas with respect to the first axis as a boundary in a plan view, a first movable electrode being provided in the first area along the first edge;
   a beam that is located on the first axis and that supports the movable body; and
   a first fixed electrode that is provided on a substrate, that extends along the first edge, and that is spaced apart from the movable body so as to face the first movable electrode,
   wherein the first fixed electrode is provided at a position overlapping with the first edge of the movable body in the plan view, and the first fixed electrode is provided in a range of $0.0500X \leq L \leq 0.816X$ when a width of the first area in a second direction perpendicular to the first direction is X and a width of an overlapped area between the first fixed electrode and the movable body in the second direction in the plan view is L, and
   the first fixed electrode extends outwardly from the first edge of the movable body in the second direction in the plan view.

2. The physical quantity sensor according to claim 1, wherein the first fixed electrode is provided in a range of $0.164X \leq L \leq 0.633X$.

3. The physical quantity sensor according to claim 1, wherein, in the movable body, the width of the first area in the second direction is smaller than a width of the second area in the second direction.

4. The physical quantity sensor according to claim 1, wherein a second movable electrode is provided in the second area and extends in the second direction, and a second fixed electrode is provided on the substrate, extends in the second direction, and is spaced apart from the movable body so as to face the second movable electrode.

5. The physical quantity sensor according to claim 4, wherein a region where the first movable electrode and the first fixed electrode overlap each other and a region where the second movable electrode and the second fixed electrode overlap each other are symmetrical with respect to the first axis in the plan view.

6. The physical quantity sensor according to claim 1, wherein the first fixed electrode extends from the first area in the first direction in the plan view.

7. The physical quantity sensor according to claim 1, wherein a first mass of the first area is smaller than a second mass of the second area.

8. The physical quantity sensor according to claim 1, wherein the substrate is formed of an insulating material, and the movable body is formed of a semiconductor material.

9. An electronic apparatus comprising:
a display;
the physical quantity sensor according to claim 1; and
a case that houses the display and the physical quantity sensor.

* * * * *